United States Patent
Wang et al.

(10) Patent No.: US 6,620,671 B1
(45) Date of Patent: Sep. 16, 2003

(54) METHOD OF FABRICATING TRANSISTOR HAVING A SINGLE CRYSTALLINE GATE CONDUCTOR

(75) Inventors: Haihong Wang, San Jose, CA (US); Joong Jeon, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/846,813

(22) Filed: May 1, 2001

(51) Int. Cl.[7] .......................................... H01L 21/8238
(52) U.S. Cl. ........................................ 438/226; 438/151
(58) Field of Search .............................. 438/226, 300, 438/305, 308, 486, 197, 307, 306, 301, 149, 151, FOR 184; 257/29.151, 29.154

(56) References Cited

U.S. PATENT DOCUMENTS 5,824,586 A * 10/1998 Wollesen et al. ..... 148/DIG. 19
6,087,235 A * 7/2000 Yu .............................. 438/300
6,287,925 B1 * 9/2001 Yu .............................. 438/301
6,346,732 B1 * 2/2002 Mizushima et al. ......... 257/382

FOREIGN PATENT DOCUMENTS

JP            10209441 A   *  8/1998   ........... H01L/29/78
JP         2000323591 A   * 11/2000   ....... H01L/21/8247

OTHER PUBLICATIONS

"The Resonant Tunnelling Transistor" by Colin Moffat, Image Processing Group, Department of Physics and Astronomy, University College London, Jul. 24, 1996.

* cited by examiner

Primary Examiner—Olik Chaudhuri
Assistant Examiner—Brook Kebede
(74) Attorney, Agent, or Firm—Foley & Lardner

(57) ABSTRACT

A method of manufacturing an integrated circuit on a substrate provides a gate structure including single crystalline material. The method can provide a first amorphous or polycrystalline semiconductor layer above a top surface of the substrate and patterning the first amorphous semiconductor layer to form a first gate conductor. The process can also include utilizing solid phase epitaxy to form a single crystal layer above the first gate conductor and patterning the single crystal layer to form a second gate conductor including the single crystal layer.

9 Claims, 2 Drawing Sheets

METHOD OF FABRICATING TRANSISTOR HAVING A SINGLE CRYSTALLINE GATE CONDUCTOR

FIELD OF THE INVENTION

The present invention relates generally to integrated circuits (ICs) and methods of manufacturing integrated circuits. More particularly, the present invention relates to a method of manufacturing integrated circuits having transistors with specialized gate conductors.

BACKGROUND OF THE INVENTION

Integrated circuits (ICs), such as, ultra-large-scale integrated (ULSI) circuits, can include as many as one million transistors or more. The ULSI circuit can include complementary metal oxide semiconductor (CMOS) field effect transistors (FETS). The transistors often include semiconductor or metal gates disposed above a channel region and between drain and source regions. The drain and source regions are typically heavily doped with a P-type dopant (boron) or an N-type dopant (phosphorous).

The semiconductive gates are conventionally manufactured from metal material or amorphous and polycrystalline material. For example, polysilicon and polysilicon/germanium gate conductors can be utilized. The polysilicon gate conductors are deposited as polysilicon material by chemical vapor deposition (CVD). The polysilicon material is generally heavily doped with P-type or N-type dopants to increase conductivity and thereafter annealed in a high temperature process to activate the dopants.

Although polysilicon gate conductors are heavily doped, gate resistance in polysilicon gate conductors can be problematic. For example, as gate conductors are reduced in size, the cross-sectional dimensions are also reduced. As gate widths become smaller, the cross sectional width of the gate conductor becomes smaller. As the thickness of the layers becomes smaller, the height of the gate conductors is also decreased. Therefore, a reduction in size of the gate conductor reduces the cross sectional area of the conductor. A reduction in cross sectional dimensions increases the resistive characteristics of the gate conductor (e.g., sheet resistance).

As the physical dimensions of CMOS transistors are decreased, control of critical dimensions (CD) associated with the gate conductor becomes more difficult. For example, as critical dimensions associated with the gate conductor (e.g., gate length) reach the nanometer dimensions, the grain structure of the polysilicon material can affect the accuracy of the gate formation process. More particularly, edge roughness due to the grain size variation in the polysilicon material can change or vary the gate length (along the width) of the transistor. This variation in gate length makes the transistor susceptible to short channel effects. Short channel effects can disadvantageously increase the leakage or off-current when the transistor is not turned on.

As critical dimensions are reduced, IC fabrication processes can manufacture specialized devices, such as, resonant tunneling transistors (RTT) which have CDs in the nanometer range. RTTs can include resonant hot-electron transistor (RHET), quantum excited state transistors (qUEST) and other configurations. These transistors are particularly susceptible to grain structure difficulties associated with polysilicon gate material.

In addition, resonant tunneling devices are easier to manufacture if high quality thermal oxide materials can be formed on the gate. Generally, polysilicon materials cannot be utilized to produce high quality thermal oxide materials.

Thus, there is a need for an integrated circuit or electronic device that includes gate conductors manufactured from a material that can be accurately patterned. Further still, there is a need for transistors with a gate conductor that are not susceptible to size variation due to granularity. Even further still, there is a need for a resonant tunneling transistor (RTT) having a specialized gate conductor. Yet even further, there is a need for a low resistance gate conductor and a method of manufacturing such a conductor.

SUMMARY OF THE INVENTION

An exemplary embodiment relates to a method of manufacturing an integrated circuit on a substrate. The method includes providing a first semiconductor layer above a surface of the substrate, patterning the first semiconductor layer to form a first gate conductor layer, utilizing solid phase epitaxy to form a single crystal layer above the first gate conductor, and patterning the single crystal layer to form a second gate conductor layer including the single crystal layer.

Another exemplary embodiment relates to a method of fabricating a transistor. The transistor includes a gate conductor comprised of single crystal silicon material. The method includes steps of providing a first thin polysilicon layer, providing a single crystal layer over the thin polysilicon layer, and patterning the single crystalline layer to form the gate conductor including the single crystal silicon material.

Yet another exemplary embodiment relates to a process of forming a transistor having a single crystal material in a gate structure. The gate structure is above a top surface of a substrate. The process includes providing a dielectric layer above a top surface of the substrate, forming a thin gate conductor layer above the dielectric layer, and etching the dielectric layer and the thin gate conductor layer to expose to the top surface of the substrate. The method further includes forming a crystallized layer over the thin gate conductor layer and etching portions of the crystallized layer to form the gate structure.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
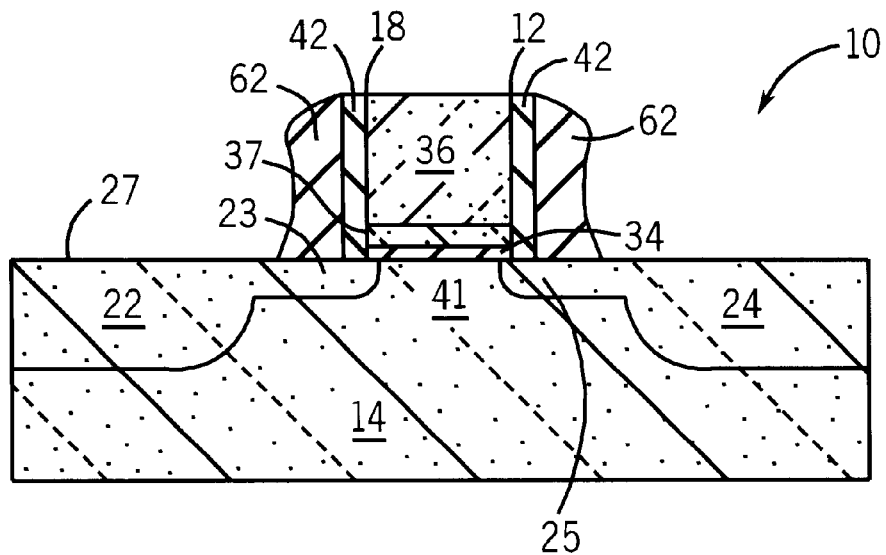
FIG. 1 is a cross-sectional view of a portion of an integrated circuit in accordance with an exemplary embodiment, the integrated circuit including a transistor provided on a portion of a substrate, the transistor having a single crystalline semiconductor gate conductor.

With reference to FIG. 1, a portion 10 of an integrated circuit (IC) includes a transistor 12 which is disposed on a semiconductor substrate 14, such as, a wafer. Semiconductor substrate 14 is preferably a bulk P-type single crystalline (001) silicon substrate. Alternatively, substrate 14 can be an N-type well in a P-type substrate, an insulative substrate, a semiconductor-on-insulator (SOI) substrate, (preferably silicon-on-glass) or other suitable material for transistor 12.

Transistor 12 can be a P-channel or N-channel metal oxide semiconductor field effect transistor (MOSFET). Transistor 12 is preferably embodied as a MOSFET and includes a gate structure 18, a source region 22, and a drain region 24. Gate structure 18 advantageously includes single crystalline material that reduces variability in gate lengths due to grain structure. In one embodiment, gate structure 18 has a gate length between source region 22 and drain region 24 in the nanometer scale.

For an N-channel transistor, regions 22 and 24 are heavily doped with N-type dopants (e.g., $5\times10^{19}$–$1\times10^{20}$ dopants per cubic centimeter). For a P-channel transistor, regions 22 and 24 are heavily doped with P-type dopants ($5\times10^{19}$–$1\times10^{20}$ dopants per cubic centimeter). An appropriate dopant for a P-channel transistor is boron, boron diflouride, or iridium, and an appropriate dopant for an N-type transistor is arsenic, phosphorous, or antimony.

Source and drain regions 22 and 24 can be provided with extensions 23 and 25. Preferably, ultra-shallow extensions 23 and 25 (e.g., junction depth is less than 20 nanometers (nm), 100–250 Å) are integral with regions 22 and 24. Source and drain extensions 23 and 25 can be disposed partially underneath gate structure 18.

A channel region 41 underneath gate structure 18 separates regions 22 and 24. Region 41 can be doped according to device parameters. For example, region 41 can be doped according to a super steep retrograded well region.

Gate stack or structure 18 includes a gate conductor 36, a gate conductor 37, and a gate dielectric layer 34. Alternatively, structure 18 can include three or more conductive or semiconductive layers.

Gate conductor 36 is preferably a single crystalline material. Gate conductor 36 has a thickness of 900–1500 Å and a width of less than 50 nm (e.g., channel length). Gate conductor 36 can be a semiconductor material implanted with dopants, with other semiconductive materials or can be an in situ doped material. Gate conductor 36 is also preferably heavily doped with an N-type dopant, such as phosphorous (P), arsenic (As) or other dopant. Alternatively, gate conductor 36 can be doped with a P-type dopant, such a boron (B), boron diflouride ($BF_2$), or other dopant.

Gate conductor 37 can be an amorphous material or a polysilicon material. Preferably, conductor 37 is a polysilicon material having a thickness of 100 Å or less and a width of less than 50 nm. According to one embodiment, conductor 37 can be a polysilicon, germanium, or a silicon/germanium material. Conductor 30 can be doped similar to conductor 36.

The use of single crystalline material for gate conductor 36 provides significant advantages over conventional transistors. For example, the use of single crystalline material in gate structure 18 allows sophisticated devices with stacked single crystal silicon and high quality thermal oxides to be manufactured, such as, resonating tunneling devices or transistors (RTTs). Further, the use of single crystalline material in conductor 36 reduces the resistance associated with gate structure 18 and improves alternating current (AC) performance. As discussed above, the use of single crystalline material for gate conductor 36 also improves gate length uniformity and critical dimension control.

Dielectric layer 34 is preferably a 15 to 25 Å thick thermally grown silicon dioxide layer. Alternatively, layer 34 can be a silicon nitride layer. Dielectric layer 34 can be comprised of a high-k dielectric material such as a 2–10 nm thick conformal layer of tantalum pentaoxide ($Ta_2O_5$), aluminum oxide ($Al_2O_3$), titanium dioxide ($TiO_2$) or other material having a dielectric constant (k) over 8.

A silicide layer can be disposed above source region 22, drain region 24, and conductor 36. Preferably, a nickel silicide ($WSi_x$) is utilized. Alternatively, the silicide layer can be any type of refractory metal and silicon combination, such as, a cobalt silicide, tungsten silicide, titanium silicide, or other silicide material.

Transistor 12 can be an N-channel or a P-channel field effect transistor, such as, a metal oxide semiconductor field effect transistor (MOSFET). Transistor 12 is at least partially covered by insulative layer 48 and is preferably part of an ultra-large scale integrated (ULSI) circuit that includes one million or more transistors.

Gate structure 18 has a height of 1000–1600 Å and can also include oxide liners 42 and spacers 62. Liners 42 are preferably rectangularly shaped oxide liners having a width of 100–150 Å and a height of 1000–1600 Å.

Spacers 62 are preferably silicon nitride spacers and have a height of 1000–1600 Å and a width of 400–600 Å. Spacers 62 abut side walls of liners 42 which abut side walls of conductors 36, 37 and layer 34. Liners 42 provide an etch stop structure for spacers 62.

With reference to FIGS. 1–5, the fabrication of transistor 12, including gate conductor 36 is described as follows. The advantageous process allows gate structure to include single crystalline semiconductor material. Single crystalline material is demonstrated by a stippled area in FIGS. 1–5.

Figure 2:
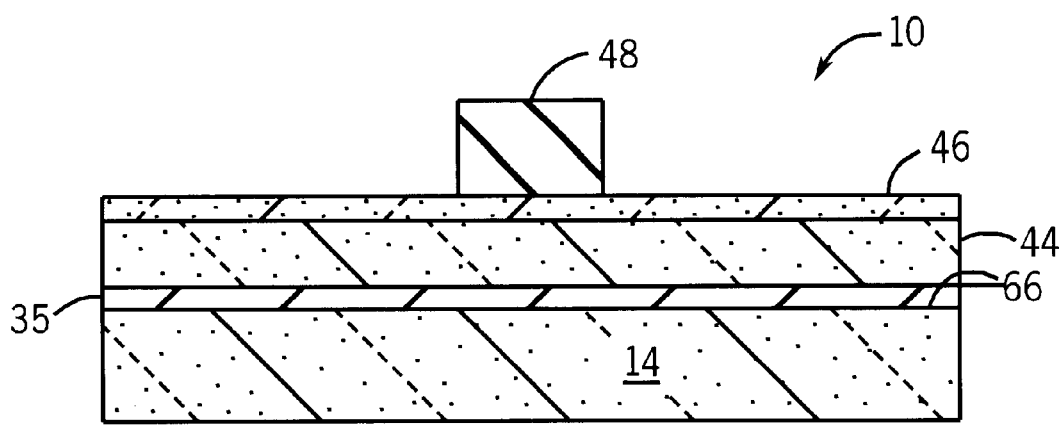
FIG. 2 is a cross-sectional view of the portion of the substrate illustrated in FIG. 1, showing a lithographic step.

In FIG. 2, a semiconductor substrate 14 is provided as a single crystalline silicon substrate. Substrate 14 can be provided as part of a semiconductor wafer. Substrate 14 has a planarized top surface 66.

A dielectric layer 35 is grown on top surface 66. Dielectric layer 35 is preferably thermally grown on top of layer 66 to a thickness between 12 and 25 Å as silicon dioxide or oxynitride. Dielectric layer 35 can also be chemical vapor deposited silicon nitride to a thickness of 8–9 Å. Layer 35 corresponds to layer 34 of structure 18 (FIG. 1).

After layer 35 is formed, a semiconductor layer 44 is provided above layer 35. Semiconductor layer 44 can be an amorphous or polycrystalline semiconductor layer such as an amorphous silicon layer or a polysilicon layer. Preferably, layer 44 is a thin layer deposited by low pressure chemical vapor deposition (LPCVD) at temperatures between 500–550 degrees C. Layer 44 can have a thickness of approximately 100 Å. Layer 44 can include germanium as well as P-type and N-type dopants.

After layer 44 is deposited, a cap layer 46 is provided above layer 44. Cap layer 46 can be a silicon oxynitride layer provided as an anti-reflective coating. Layer 46 is preferably 300–500 Å thick.

After layer 46 is provided, a photoresist layer is spun on to layer 46. The photoresist layer is patterned in accordance with a photolithographic process to leave a feature 48. Preferably, feature 48 has a width of less than 50 nm, the dimension associated with the width of structure 18. Any conventional photolithographic process can be utilized to create feature 48.

Figure 3:
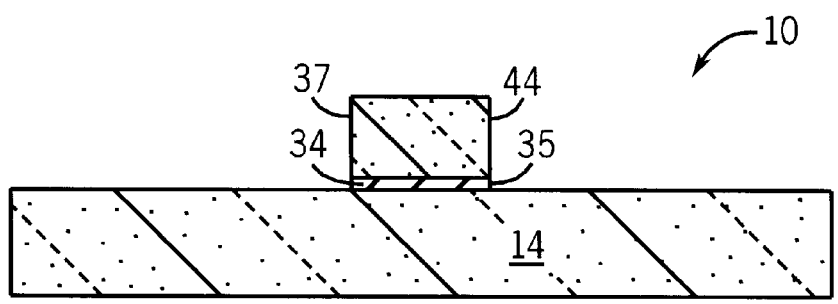
FIG. 3 is a cross-sectional view of the portion of the substrate illustrated in FIG. 2, showing a first etching step.

With reference to FIG. 3, layers 46, 44 and 35 are etched in accordance with feature 48. After etching, layer 46 is stripped in a conventional process. Layer 35 is etched to have a form of dielectric layer 34 and layer 44 is etched to have the width of gate conductor 37. Layers 46, 44, and 35 can be etched in a dry etching process.

Figure 4:
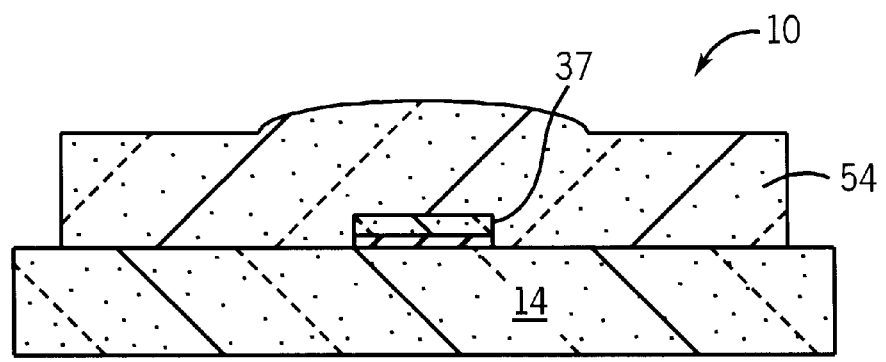
FIG. 4 is a cross-sectional view of the portion of the substrate illustrated in FIG. 3, showing a solid phase epitaxy step.

With reference to FIG. 4, a single crystalline semiconductor layer 54 is formed over substrate 14 and gate conductor 34. Preferably, layer 54 is 1000 Å thick layer of silicon, germanium, or silicon/germanium material formed over the locations of source and drain regions 22 and 24 (FIG. 11). Layer 54 can be deposited by LPCVD at a temperature between 800–850 degrees C. using silane gas. Preferably, the epitaxy process utilizes substrate 14 as a seed region. Layer 54 is single crystalline due to lateral source/drain epitaxy.

In one embodiment, a solid phase epitaxy technique is utilized to crystallize layer 54. Solid phase epitaxy refers to a crystallization process by which an amorphous semiconductor film (silicon, silicon/germanium, or germanium) is converted into crystalline semiconductor (silicon, silicon/germanium, or germanium) of a single orientation matching the orientation of an existing crystal structure (silicon, silicon/germanium, or germanium) start layer. Solid phase epitaxy is usually achieved by heating the amorphous semiconductor layer. Alternatively, a low temperature (e.g., 550–600° C.) rapid thermal anneal can be utilized.

In another alternative, the annealing process is an excimer laser anneal process having a pulse duration of several nanoseconds and a wavelength of 308 nm. Excimer laser annealing can raise the temperature of layer 54 (in an amorphous state) to the melting temperature of layer 54 (1100° C. for silicon). The melting temperature of layer 54 in the amorphous state is significantly lower than that of substrate 14 which is in the crystalline state. For example, the melting temperature of amorphous silicon is 1100° C. and the melting temperature of single crystal silicon is 1400° C. Preferably, the excimer laser annealing process is controlled so that layer 47 is fully melted and substrate 14 is not melted. After the energy associated with the annealing process is removed, layer 54 is recrystallized as a single crystal material (e.g., gate conductor 36 in FIG. 1).

Figure 5:
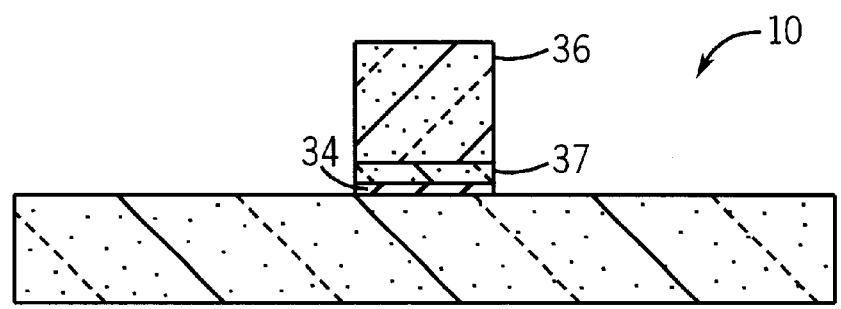
FIG. 5 is a cross-sectional view of the portion of the substrate illustrated in FIG. 4, showing a second etching step.

With reference to FIG. 5, layer 54 is patterned to form gate conductor 36 above gate conductor 37 and gate dielectric layer 34. Gate conductor 36 can be patterned by any suitable process. For example, a conventional photolithographic process similar to the process discussed with reference to FIGS. 2 and 3 can be utilized to form gate conductor 36.

Gate conductor 36 preferably has a thickness of 900–1500 Å and a width of less than 50 nm. Any suitable etching technique can be utilized to pattern layer 54, thereby exposing the location of source and drain regions 22 and 24. For example, plasma dry etching can be utilized.

Before gate layer 54 is patterned, polysilicon material can be deposited on other portions of the integrated circuit associated with longer channel devices. The polysilicon material can be etched according to the same patterning process utilized to pattern gate conductor 36. In this way, the integrated circuit can include a number of devices having small gate lengths (gate conductor 36) and a number of devices having longer gate lengths with conventional gate conductor materials, such as polysilicon.

Before liners 42 and spacers 62 are formed, a shallow source/drain implant can be provided to form extensions 23 and 25. Oxide side walls 42 can be grown on gate conductor 36 and gate conductor 37 as silicon dioxide material. Liners 42 can be high quality oxide material due to the single crystal nature of gate conductor 36. After liners 42 are formed, spacers 62 are formed in a conventional deposition and etch-back process.

After spacers 62 are formed, a deep source/drain implant is provided to complete regions 22 and 24. After implanting dopants for regions 22 and 24, an annealing step can be performed to activate dopants in substrate 14 and structure 18.

Spacers 62 have a width of 400–600 Å. Liners 41 have a width of 100–150 Å.

After spacers 62 are formed, various conventional integrated circuit fabrication process can be provided to connect structures and isolate structures. For example, gate structure 18 can be covered with an insulative layer and contact and other interconnects can be provided above substrate 14.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of semiconductor germanium layers are shown, other structures can be utilized. Various changes may be made to the details disclosed without departing from the spirit of the invention which is defined by the following claims.

What is claimed is:

1. A method of fabricating transistor, the transistor including a gate conductor comprised of single crystalline silicon material, the method comprising steps of:

providing a first thin polysilicon layer wherein the first thin polysilicon layer is less than 100 Å;

providing a single crystalline layer above the first thin polysilicon layer; and patterning the single crystalline layer to form the gate conductor including the single crystalline silicon material.

2. The method of claim 1, further comprising:

providing an oxide liner and a dielectric spacer on sidewalls of the single crystalline layer.

3. The method of claim 1, wherein a cap layer is provided over the first thin polysilicon layer.

4. The method of claim 3, wherein the first thin polysilicon layer is doped.

5. The method of claim 4, wherein the transistor is a MOSFET.

6. The method of claim 5, wherein the width of the gate conductor is less than 200 Å wide.

7. A process of forming a transistor having a single crystal material in a gate structure, the gate structure being above a top surface of a substrate, the process comprising:

providing a dielectric layer above a top surface of the substrate;

forming a thin gate conductor layer including polysilicon above the dielectric layer, the thin gate conductor layer having a thickness of less than 100 Å;

etching the dielectric layer and the thin gate conductor layer to expose the top surface of the substrate;

forming a crystallized layer over the thin gate conductor layer; and etching portions of the crystallized layer to form the gate structure.

8. The process of claim 7, further comprising:

providing a source region and a drain region for the transistor, the source region and the drain region extending into the substrate.

9. The process of claim 8, wherein the crystallized layer is 100 Å thick.

* * * * *